March 2, 1965 A. H. ASHLEY ETAL 3,171,975

TRANSISTORIZED PULSE SHAPING CIRCUIT

Filed May 31, 1961

INVENTORS
ALBERT H. ASHLEY
EDMUND U. COHLER
ALVIN A. VAGGE

BY F. I. Sullivan
ATTORNEY 3,171,975

TRANSISTORIZED PULSE SHAPING CIRCUIT

Alvin A. Vagge, Denver, Colo., and Albert H. Ashley, Holliston, and Edmund U. Cohler, Brookline, Mass., assignors to Sylvania Electric Products Inc., a corporation of Delaware Filed May 31, 1961, Ser. No. 113,876
3 Claims. (Cl. 307—88.5)

This invention is concerned with electronic pulse circuits and particularly with an improved pulse generator useful in electronic data processing systems.

Many present day data processing systems utilize a central processing unit, wherein all timing signals necessary in the system are generated. Long distances, however, often separate the central processing unit from those units requiring timing pulses. As a result, long transmission lines are required which cause severe attenuation and distortion to the timing pulses. This cannot be tolerated in digital circuitry where square waves of a definite amplitude are necessary to obtain high speeds and proper circuit functioning. One means of overcoming this problem is through the use of local pulse generators. Voltage levels instead of pulses are transferred over the lines and a pulse generator located proximate utilizing circuits converts them to timing pulses. The only deterioration thus caused occurs during rise and fall times. A ringing type of pulse generator may be used for this application. Such a circuit, however, is inherently sensitive to the pulse repetition rate of the timing signals, particularly when this rate is a high value; and, when this occurs, the amplitude of the pulse generated falls below standard voltage level.

Accordingly a primary object of this invention is to provide an improved pulse generator and particularly one which is insensitive to input pulse repetition rate.

These and related objects are accomplished in one embodiment of the invention by a transistorized, ringing type of pulse generator which features a resistance bypassing the inductance in the ringing circuit to render it insensitive to pulse repetition rate.

Figure 1:
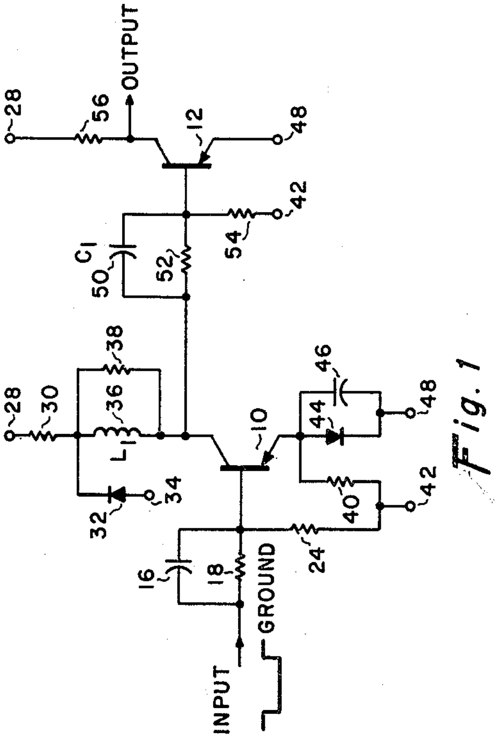
FIG. 1 is a diagrammatic representation of a first pulse generator.

In FIG. 1, assuming that the input is at its negative level so that transistor 10 is saturated, inductor 36 is fully charged and diode 32 is back-biased. This quiescent state is maintained until the input rises in a positive direction and turns transistor 10 off. Stabistor 44, by-passed by decoupling capacitor 46, then acts as a voltage source and places a slightly positive voltage on the emitter of transistor 10. Also, with transistor 10 cut off the back bias is removed from diode 32 and it starts to conduct. As collector current for transistor 10 decreases, the inductor field collapses, and the circuit rings due to the combined effect of inductor 36 and capacitor 50. The initial ringing occurs in the negative direction and is critically damped to zero volts by resistor 38. Consequently, only one pulse is generated at the output of transistor 10 for each positive excursion at the input. Transistor 12 is ordinarily off except for the time when it is turned on by the ringing pulse. Its purpose is to shape, invert, and emit this pulse. During the remainder of the off time for transistor 10, diode 32 holds transistor 12 off.

Pulse width is entirely dependent on inductor 36, $L_1$, and capacitor 50, $C_1$, since pulse width$=\pi\sqrt{L_1C_1}$. The amplitude of the pulse which drives transistor 12 is determined by the following formula:

$$V=\frac{2}{\pi}[i_0\sqrt{L_1/C_1}]$$

where $i_0$=the instantaneous inductor current occurring when transistor 10 comes out of saturation.

Transistor 10 remains quiescently off after the ringing pulse is terminated until such time as its input level goes negative. At this time diode 32 is conducting and inductor 36 begins to charge. It charges only during the time of changing collector current.

Since $$dic/dt=e_L/L_1$$

where $dic/dt$=changing collector current and $e_L$=inductor voltage, the charging rate of the inductor 36 is limited by $e_L$. Diode 32 clamps the upper end of inductor 36 to its diode voltage $V_f$. If the standard grounded emitter configuration were used for transistor 10, the voltage across inductor 36 becomes $V_f-V_{ce}$, which is a small value. Consequently the charging of inductor 36 will be quite slow. It is conceivable that if the pulse repetition rate were too fast, transistor 10 could be compelled to ring before its quiescent collector current had been attained. This results in the production of a voltage ringing pulse whose amplitude is less than standard value. In order to make the circuit insensitive to the pulse repetition rate, inductor 36 must be permitted to charge to the full quiescent current of transistor 10 in a time less than one-half the input period. To allow for a fast pulse repetition rate $e_L$ must be made larger than the small value attainable by the standard grounded emitter configuration. This is accomplished by connecting resistor 40, whose opposite end is attached to positive voltage source 42, to the emitter.

Figure 2:
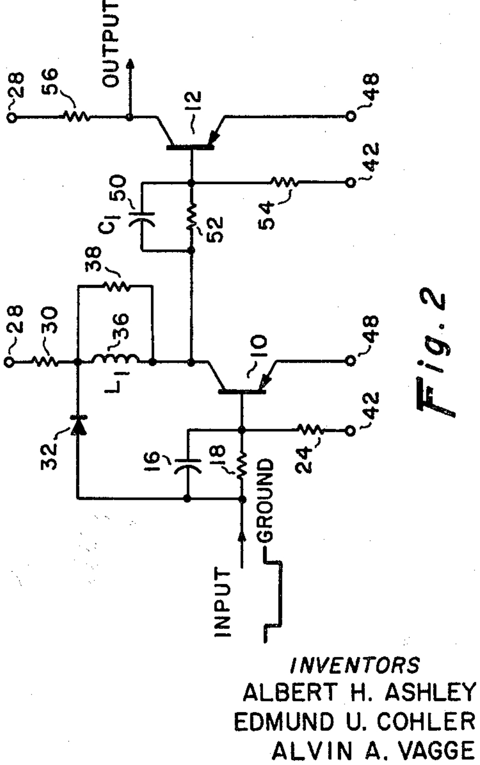
FIG. 2 is a diagrammatic representation of a second pulse generator.

In FIG. 2, assuming that the input is at its negative voltage level so that transistor 10 is saturated, inductor 36 is fully charged and diode 32 is back-biased. When the circuit input goes to its positive level, transistor 10 turns off producing a critically damped ringing pulse. This pulse turns transistor 12 on during the pulse duration and then diode 32, which is connected to the positive input turns it off. As the input again goes negative so that the inductor 36 begins to charge, diode 32 is back-biased and $e_L$ becomes half the value of voltage source 28 since resistor 30 is equal in value to resistor 38. This is large enough to allow full charging of inductor 36 before the next positive input level arrives.

Figure 3:
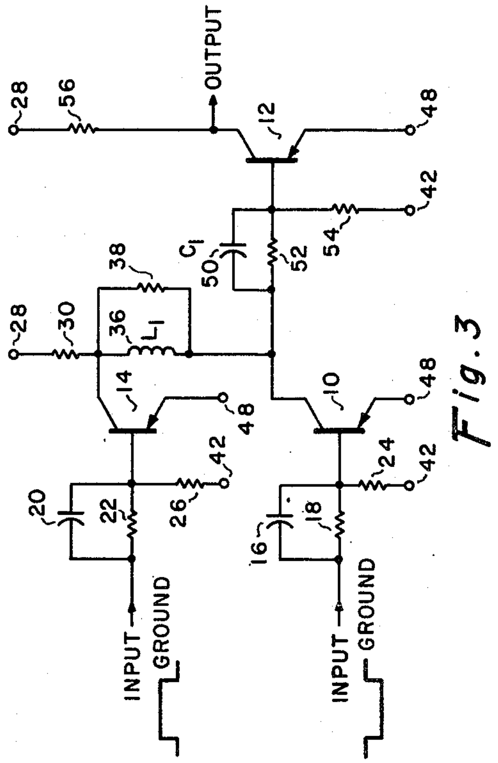
FIG. 3 is a diagrammatic representation of a third pulse generator.

In FIG. 3, assuming that the input to transistor 10 is at its negative voltage level and the input to transistor 14 is at its positive voltage level, inductor 36 is fully charged, transistor 10 is saturated, and transistor 14 is cut off. When the input pulses reverse their direction, transistor 10 turns off producing a critically damped ringing pulse and transistors 14 and 12 turn on. Transistor 12 turns off again at the end of this pulse since the collector of transistor 14 is shorted to potential 48 which is ground. As the input to transistor 10 again goes negative and the input to transistor 14 goes positive, transistor 10 turns on and transistor 14 turns off. Thus, the voltage across inductor 36 becomes equal to half the value of source 28.

Figure 4:
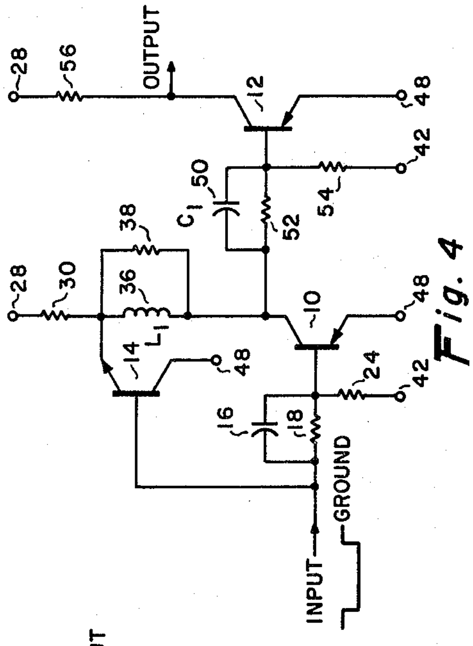
FIG. 4 is a diagrammatic representation of a fourth pulse generator, all embodying the invention.

In FIG. 4 assuming that the input is at its negative voltage level so that transistor 10 is saturated, the emitter-follower action of transistor 14 allows inductor 36 to be fully charged. When the input goes to its positive level, transistor 10 turns off and produces a critically damped voltage pulse which turns transistor 12 on. Transistor 12 turns off again at the end of this pulse since the emitter-follower 14 places the positive input level or ground at the terminal or node connection between resistor 30 and inductor 36. As the input again goes positive, $e_L$ becomes equal to half the value of source 28.

The following values and commercial identities of components are recommended for the pulse generator disclosed.

| | | |
|---|---|---|
| Capacitor **16** | μμf | 68 |
| Resistor **18** | | 1K |
| Capacitor **20** | μμf | 68 |
| Resistor **22** | | 1K |
| Resistor **24** | | 2.2K |
| Resistor **26** | | 2.2K |
| Potential at source **28** | v | −10 |
| Resistor **30** | ohms | 560 |
| Diode **32** | | IN277 |
| Potential at source **34** | v | 0 |
| Inductor **36** | μh | 8.2 |
| Resistor **38** | ohms | 560 |
| Resistor **40** | do | 100 |
| Potential at source **42** | v | +4 |
| Stabistor **44** | | IN816 |
| Capacitor **46** | μf | 15 |
| Potential at source **48** | v | 0 |
| Capacitor **50** | μμf | 100 |
| Resistor **52** | | 1K |
| Resistor **54** | | 6.8K |
| Resistor **56** | ohms | 560 |

The invention is not limited to the specific of the preceding description of illustrative embodiments, but embraces the full scope of the following claims.

What is claimed is:

1. A pulse generator insensitive to the repetition rate of input signals comprising: a first transistor having collector, base, and emitter electrodes; an input terminal; a first resistor connecting said input terminal to said first transistor base; a first capacitor connected in parallel with said first resistor; a first source of reference potential; a second resistor connecting said first transistor base to said first source of reference potential; a junction; an inductor connecting said junction to said first transistor collector; a second transistor having collector, base, and emitter electrodes; a third resistor connecting said first transistor collector to said second transistor base; a second capacitor connected in parallel with said third resistor; a fourth resistor connecting said first source of reference potential to said second transistor base; a second source of reference potential; a fifth resistor connecting said second source of reference potential to said second transistor collector; an output terminal connected to said second transistor collector; a third source of reference potential connected to said second transistor emitter; and, means operative to charge said inductor during a short space of time while said first transistor is saturated and to cause said inductor and said second capacitor to produce ringing while said first transistor is cutoff comprising a source of current connected to said junction, a first diode connecting said junction to said third source of reference potential, a damping resistor connected in parallel with said inductor, and means connected to said first transistor emitter comprising a sixth resistor connected to said first source of reference potential, a second diode connected to said third source of reference potential, and a third capacitor connected to said third source of reference potential.

2. A pulse generator insensitive to the repetition rate of input signals comprising: a first transistor having collector, base, and emitter electrodes; an input terminal; a first impedance means connecting said input terminal to said first transistor base; a junction; an inductor connecting said junction to said first transistor collector; a second transistor having collector, base, and emitter electrodes; a second impedance means connecting said first transistor collector to said second transistor base; a capacitor connected in parallel with said second impedance means; a first source of reference potential connected to said second transistor emitter; an output terminal connected to said second transistor collector; and, means operative to charge said inductor during a short space of time while said first transistor is saturated and to cause said inductor and capacitor to produce ringing while said first transistor is cut-off including a source of current connected to said junction, a diode connecting said junction to said source of reference potential, a damping resistor connected in parallel with said inductor and means connected to said first transistor emitter including a third impedance means connected to a second source of reference potential, a diode connected to said first source of reference potential, and a second capacitor connected to said first source of reference potential.

3. A circuit for shaping input pulse signals comprising, first and second transistors each having base, emitter and collector electrodes, an input terminal to which said pulse signals are applied, a first resistor and a first capacitor connected in parallel between said input terminal and the base electrode of said first transistor, a first source of reference potential, second and third resistors connected between said first source of potential and the base electrode of said first and second transistors, respectively, a second source of potential, an inductor and a fourth resistor connected in series between the collector electrode of said first transistor and said second source of potential, a fifth resistor connected between the collector electrode of said second transistor and said second source of potential, an output terminal connected to the collector electrode of said second transistor, a sixth resistor and a second capacitor connected in parallel between the collector electrode of said first transistor and the base electrode of said second transistor, a third source of potential, means directly connecting said third source of potential to the emitter electrode of said second transistor, and means operative to produce rapid buildup of current in said inductor while said first transistor is saturated and to cause ringing of said inductor and said second capacitor while said first transistor is cut off including a source of current connected to the junction of said inductor and said fourth resistor, a damping resistor connected in parallel with said inductor, and means connected to the emitter electrode of said first transistor comprising a seventh resistor connected to said first source of potential and a diode and a third capacitor connected in parallel to said third source of potential.

References Cited in the file of this patent

UNITED STATES PATENTS

| | | |
|---|---|---|
| 2,946,899 | Day | July 26, 1960 |
| 3,001,091 | Kaiser et al. | Sept. 19, 1961 |

OTHER REFERENCES

"Pulse Shaper," Transistor Digital Circuits Series 100, Bulletin TDC–114, Epsco Components, November 1, 1958.